United States Patent
Yoon et al.

(10) Patent No.: US 8,274,779 B2
(45) Date of Patent: Sep. 25, 2012

(54) EMBEDDED CAPACITOR, EMBEDDED CAPACITOR SHEET USING THE SAME AND METHOD OF MANUFACTURING THE SAME

(75) Inventors: Jung Rag Yoon, Gyeonggi-do (KR); Kyung Min Lee, Gyeonggi-do (KR); Jeong Woo Han, Seoul (KR)

(73) Assignee: Samhwa Capacitor Co., Ltd., Kyoungki-Do (KR)

( * ) Notice: Subject to any disclaimer, the term of this patent is extended or adjusted under 35 U.S.C. 154(b) by 456 days.

(21) Appl. No.: 12/453,635

(22) Filed: May 18, 2009

(65) Prior Publication Data

US 2010/0271748 A1    Oct. 28, 2010

(30) Foreign Application Priority Data

Apr. 24, 2009  (KR) .................. 10-2009-0035827

(51) Int. Cl.
  *H01G 4/06*    (2006.01)
  *H01G 4/20*    (2006.01)
  *H01G 4/005*   (2006.01)
  *H01G 4/38*    (2006.01)
(52) U.S. Cl. ................ 361/313; 361/303; 361/330
(58) Field of Classification Search ........... 361/301.3, 361/313, 303, 328, 329, 330
  See application file for complete search history.

(56) References Cited

U.S. PATENT DOCUMENTS

| | | | | |
|---|---|---|---|---|
| 3,260,904 A | * | 7/1966 | Booe | 361/313 |
| 4,930,044 A | * | 5/1990 | Eda et al. | 361/313 |
| 5,162,977 A | * | 11/1992 | Paurus et al. | 361/762 |
| 5,495,386 A | * | 2/1996 | Kulkarni | 361/303 |
| 6,005,197 A | | 12/1999 | Kola et al. | |
| 7,276,412 B2 | * | 10/2007 | Kim | 438/255 |
| 7,524,552 B2 | * | 4/2009 | Yokota et al. | 428/210 |
| 7,539,005 B2 | * | 5/2009 | Uchida et al. | 361/311 |
| 7,629,269 B2 | * | 12/2009 | Palanduz | 438/761 |
| 7,742,277 B2 | * | 6/2010 | Shinoda et al. | 361/311 |
| 2004/0109298 A1 | * | 6/2004 | Hartman et al. | 361/762 |
| 2006/0046377 A1 | * | 3/2006 | Koiwa et al. | 438/238 |
| 2007/0097596 A1 | * | 5/2007 | Kuwajima et al. | 361/311 |
| 2009/0135545 A1 | * | 5/2009 | Thomas et al. | 361/305 |

FOREIGN PATENT DOCUMENTS

| | | |
|---|---|---|
| JP | 08330179 A * | 12/1996 |
| JP | 10150151 A * | 6/1998 |

* cited by examiner

*Primary Examiner* — David M Sinclair
(74) *Attorney, Agent, or Firm* — Rosenberg, Klein & Lee

(57) ABSTRACT

Provided are an embedded capacitor, an embedded capacitor sheet using the embedded capacitor, and a method of manufacturing the same that may increase a surface area to thereby increase a capacity for each unit area and may provide an embedded capacitor in a sheet to thereby readily lay the embedded capacitor on an embedded printed circuit board. The embedded capacitor may include: a common electrode member 11 including a plurality of grooves 11*a*; a sealing dielectric layer 12 being formed by sealing a nano dielectric powder with a high dielectric constant in the plurality of grooves 11*a* formed in the common electrode member 11; a buffer dielectric layer 13 sealing and smoothing an uneven portion of the sealing dielectric layer 12 by applying a paste or a slurry including epoxy of 20 Vol % through 80 Vol % and dielectric powder of 20 Vol % through 80 Vol % with respect to the sealing dielectric layer 12; and an individual electrode member 14 being formed on the buffer dielectric layer 13.

2 Claims, 5 Drawing Sheets

EMBEDDED CAPACITOR, EMBEDDED CAPACITOR SHEET USING THE SAME AND METHOD OF MANUFACTURING THE SAME

CROSS-REFERENCE TO RELATED APPLICATION

This application claims the benefit of Korean Patent Application No. 10-2009-00035827, filed on Apr. 24, 2009, in the Korea n Intellectual Property Office, the disclosure of which is incorporated herein by reference.

BACKGROUND OF THE INVENTION

1. Field of the Invention

The present invention relates to an embedded capacitor, an embedded capacitor sheet using the embedded capacitor, and a method of manufacturing the same, and more particularly, to an embedded capacitor, an embedded capacitor sheet using the embedded capacitor, and a method of manufacturing the same that may increase a surface area to thereby increase a capacity for each unit area and may provide an embedded capacitor in a sheet to thereby readily lay the embedded capacitor on an embedded printed circuit board.

2. Description of the Related Art

Embedded passive devices may be integrated in any one layer of a printed circuit board in a multi-layer structure by removing conventional individual passive devices from a surface of a substrate. The printed circuit board where the embedded passive devices are integrated is referred to as an embedded printed circuit board. The embedded printed circuit board may decrease a mounting area of passive devices to thereby increase a mounting density and may also shorten an access length between the passive devices to thereby decrease a parasitic inductance component and to enhance an electrical performance.

There is an increasing interest regarding a capacitor among embedded passive devices. The capacitor is most widely used among passive devices mounted to a single printed circuit board, and also plays an important role as a decoupling or bypass capacitor on a circuit of an electronic product. Therefore, there is a need to enhance an electrical performance. Due to the above reason, an embedded capacitor is most widely used.

The embedded capacitor includes a lower electrode, a dielectric substance, and an upper electrode. The dielectric substance is formed by applying a dielectric material on the whole surface of the lower electrode. The upper electrode is formed by applying a conductive material on the dielectric substance, compressing a foil and then patterning the same. The embedded capacitor having the above structure may be applied to the embedded printed circuit board in a multi-layer structure.

A conventional embedded capacitor is applied on an embedded printed circuit board and thus is manufactured in a thin film. Also, a high dielectric material is applied to the conventional embedded capacitor in order to increase a dielectric constant. The conventional embedded capacitor needs a technology that may increase a surface area for each unit area in order to have a high dielectric constant and to increase a mounting density of the embedded printed circuit board.

SUMMARY OF THE INVENTION

The present invention is conceived to solve the aforementioned problems found in the conventional art, and thus provides an embedded capacitor that may form a plurality of grooves to be porous on the surface of a common electrode member and thereby may increase a surface area for each unit area, and a manufacturing method thereof.

The present invention also provides an embedded capacitor that may uniformly and finely bottom up fill a dielectric material in a plurality of grooves formed on a common electrode member by manufacturing the dielectric material into a nano powder and then filling the nano powder in the plurality of grooves using an electrophoresis scheme, and a manufacturing method thereof.

The present invention also provides an embedded capacitor that may smooth the surface of a dielectric material by filling the dielectric material in a plurality of grooves formed on a common electrode member and then applying the mixture of epoxy and ceramic, and a manufacturing method thereof.

The present invention also provides an embedded capacitor sheet that may form an embedded capacitor in a sheet and thereby may readily lay the embedded capacitor on an embedded printed circuit board, and a manufacturing method thereof.

According to an aspect of the present invention, there is provided an embedded capacitor including: a common electrode member including a plurality of grooves; a sealing dielectric layer being formed by sealing a nano dielectric powder with a high dielectric constant in the plurality of grooves formed in the common electrode member; a buffer dielectric layer sealing and smoothing an uneven portion of the sealing dielectric layer by applying a paste or a slurry including epoxy of 20 Vol % through 80 Vol % and dielectric powder of 20 Vol % through 80 Vol % with respect to the sealing dielectric layer; and an individual electrode member being formed on the buffer dielectric layer.

According to another aspect of the present invention, there is provided an embedded capacitor sheet including: a common electrode member including a plurality of grooves; a sealing dielectric layer being formed by sealing a nano dielectric powder with a high dielectric constant in the plurality of grooves formed in the common electrode member; a buffer dielectric layer sealing and smoothing an uneven portion of the sealing dielectric layer by applying a paste or a slurry including epoxy of 20 Vol % through 80 Vol % and dielectric powder of 20 Vol % through 80 Vol % with respect to the sealing dielectric layer; and a plurality of individual electrode members being formed on the buffer dielectric layer.

BRIEF DESCRIPTION OF THE DRAWINGS

The above and/or other aspects of the present invention will become apparent and more readily appreciated from the following description of the exemplary embodiments, taken in conjunction with the accompanying drawings in which.

DETAILED DESCRIPTION OF THE INVENTION

Hereinafter, an embedded capacitor and a manufacturing method thereof according to an embodiment of the present invention will be described with reference to the accompanying drawings.

As shown in FIGS. 1 through 4, an embedded capacitor according to an embodiment of the present invention may include a common electrode member 11, a sealing dielectric layer 12, a buffer dielectric layer 13, and an individual electrode member 14. Here, the sealing dielectric layer 12 and the buffer dielectric layer 13 may function as a dielectric substance of the embedded capacitor C. The common electrode member 11 and the individual electrode member 14 may function as an upper electrode and a lower electrode, respectively, to constitute a single embedded capacitor C.

Figure 1:
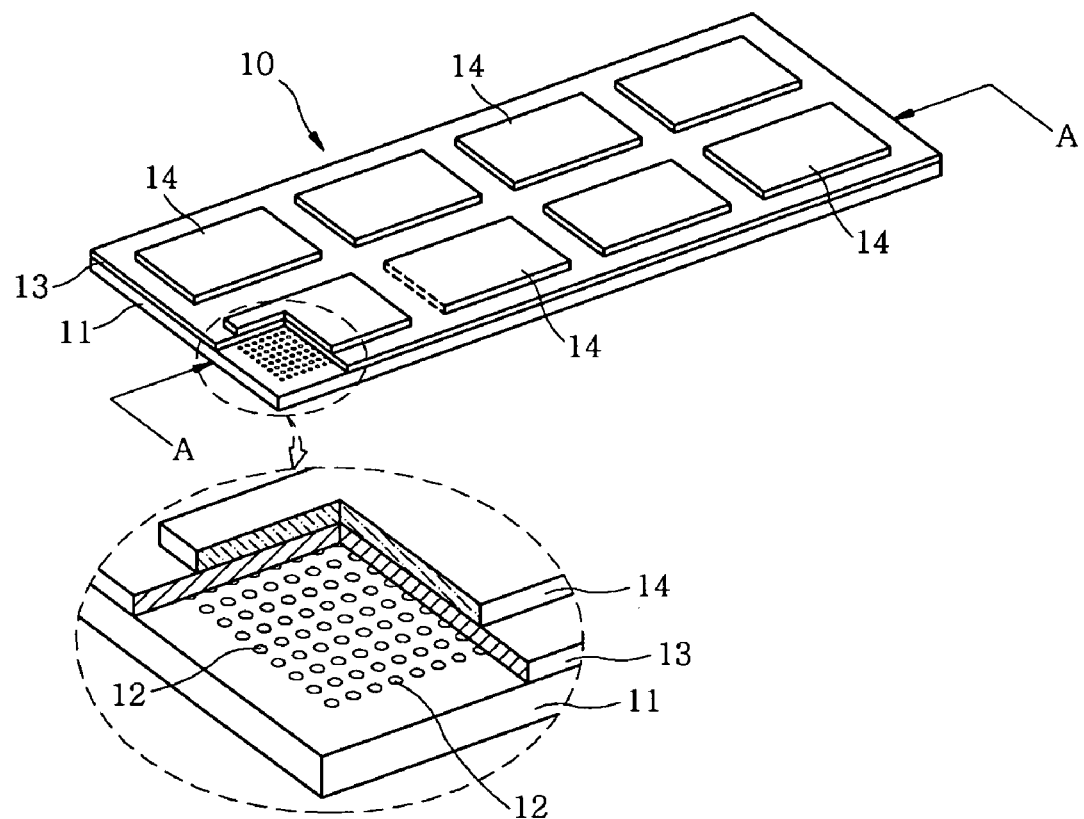
FIG. 1 is a perspective view of an embedded capacitor sheet according to an embodiment of the present invention.
Figure 2:
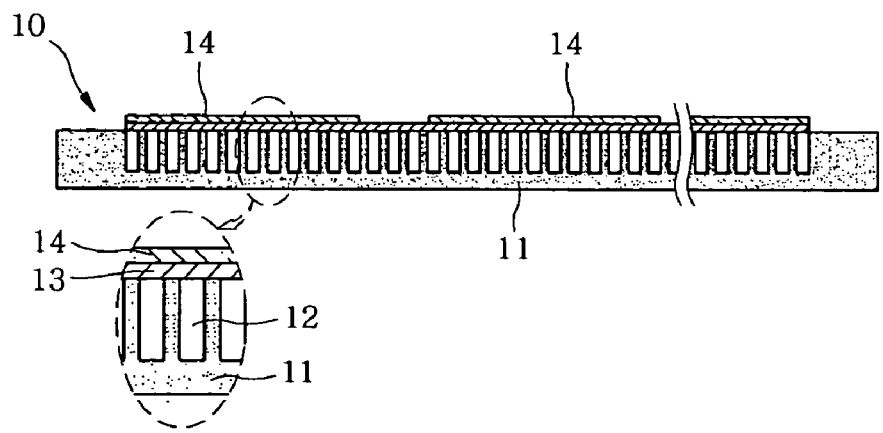
FIG. 2 is a cross-sectional view illustrating an example cut along A-A line of the embedded capacitor sheet of FIG. 1.
Figure 3:
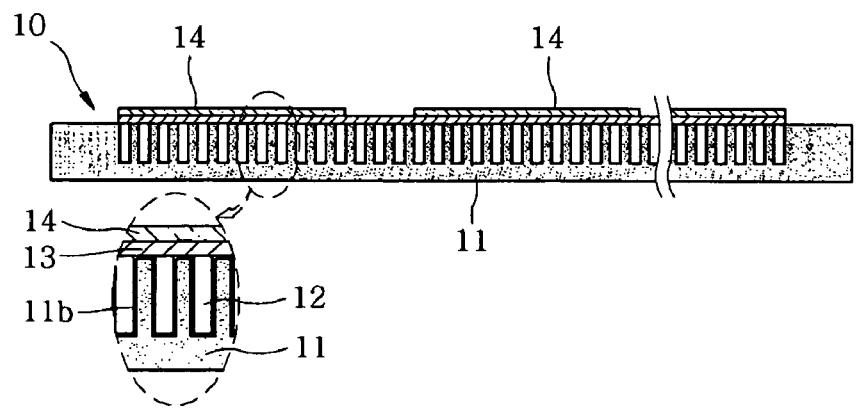
FIG. 3 is a cross-sectional view illustrating another example cut along A-A of the embedded capacitor of FIG. 1.
Figure 4:
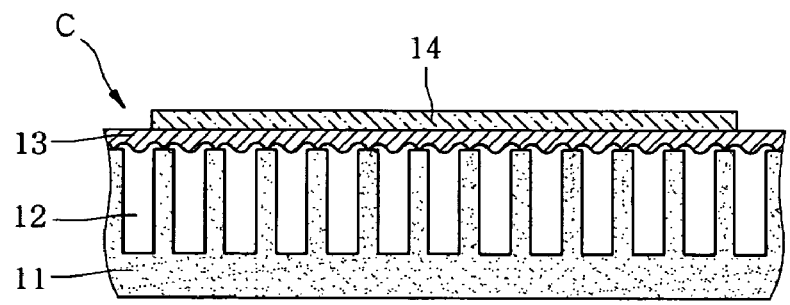
FIG. 4 is an enlarged cross-sectional view of an embedded capacitor of FIG. 2.

A plurality of grooves 11a (see FIG. 5a) may be formed on the common electrode member 11 in order to increase a surface area and to thereby increase an electrical capacity of the single embedded capacitor C. The plurality of grooves 11a may be formed by a dry etching scheme, a wet etching scheme, or an anodizing scheme. The plurality of grooves 11a may be arranged on the common electrode member 11. As shown in FIG. 3, when forming the plurality of grooves 11a using the anodizing scheme, the common electrode member 11 may further include an oxide layer 11b.

When forming the plurality of grooves 11a using the anodizing scheme, the oxide layer 11b may be formed on the plurality of grooves 11a and the whole surface where the plurality of grooves 11a is formed. Also, when forming the plurality of grooves 11a using the anodizing scheme, the plurality of grooves 11a may be formed to be porous. The common electrode member 11 with the plurality of grooves 11a may use any one of aluminum (Al), tantalum (Ta), and copper (Cu).

The sealing dielectric layer 12 may be formed by sealing a nano dielectric powder with a high dielectric constant in the plurality of grooves 11a formed on the common electrode member 11. The nano dielectric powder of the sealing dielectric layer 12 may use any one of $BaTiO_3$, $SrTiO_3$, $CaTiO_3$, $TiO_2$, and $Ta_2O_5$, and a particle size thereof is 10 nm through 300 nm.

The buffer dielectric layer 13 may seal and smooth an uneven portion 12a (see FIG. 5e) of the sealing dielectric layer 12 by applying a paste or a slurry including epoxy of 20 Vol % through 80 Vol % and dielectric powder of 20 Vol % through 80 Vol % with respect to the sealing dielectric layer 12. The dielectric powder of the buffer dielectric layer 12 may use any one of $BaTiO_3$, $SrTiO_3$, $CaTiO_3$, $TiO_2$, and $Ta_2O_5$, and a particle size thereof is 0.1 μm through 10 μm.

The uneven portion 12a that may be formed while forming the sealing dielectric layer 12 may be generated while sealing the sealing dielectric layer 12 from the bottom of the grooves 11a. When the uneven portion 12a is greater than FIG. 5e, it may make manufacturing of an embedded printed circuit board ePCB (see FIG. 6) difficult. Specifically, when providing the embedded capacitor C between a plurality of printed circuit board layers 1 and 2 (see FIG. 6), the printed circuit board layers 1 and 2 may be transformed, or may not be accurately arranged due to the uneven portion 12a. In order to solve the above problem, the uneven portion 12a may be smoothed by forming the sealing dielectric layer 12 and then forming the buffer dielectric layer 13.

When the buffer dielectric layer 13 is formed, the individual electrode member 14 may be formed on the buffer dielectric layer 13. The single individual electrode member 14 may constitute the single embedded capacitor C together with the common electrode member 11, the sealing dielectric layer 12, and the buffer dielectric layer 13. A material of the individual electrode member 13 may use a conductive material, that is, any one of Al, Ta, Ag, and Cu, which is the same as the common electrode member 11.

Hereinafter, a manufacturing method of the embedded capacitor C constructed as above according to an embodiment of the present invention will be described with reference to FIGS. 4 and 5a through 5g.

Figure 5A:
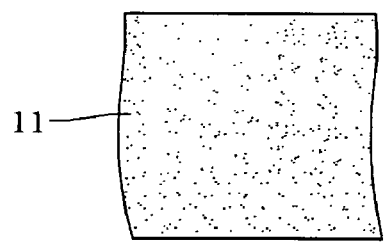
FIGS. 5A through 5G are cross-sectional views for describing a method of manufacturing an embedded capacitor according to an embodiment of the present invention.
Figure 5B:
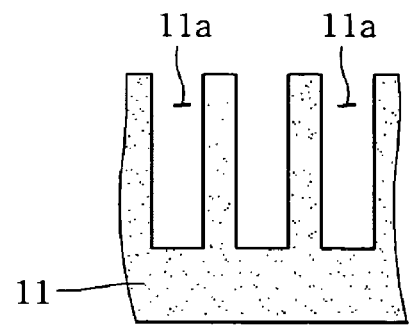

When the common electrode member 11 is provided as shown in FIG. 5a, the plurality of grooves 11a may be formed on the common electrode member 11 using an etching scheme as shown in FIG. 5b. A particle size of the grooves 11a may be formed to be 1 μm through 20 μm to thereby maximize the surface area of the common electrode member 11. The etching scheme to increase the surface area may use a dry etching scheme, a wet etching scheme, or an anodizing scheme.

Figure 5C:
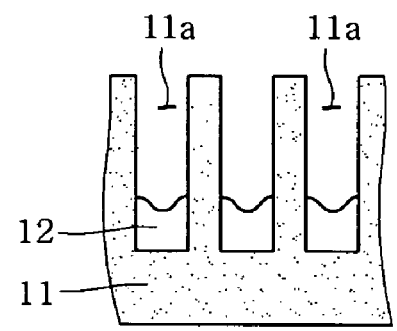
Figure 5D:
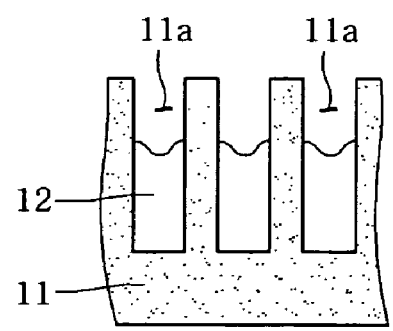
Figure 5E:
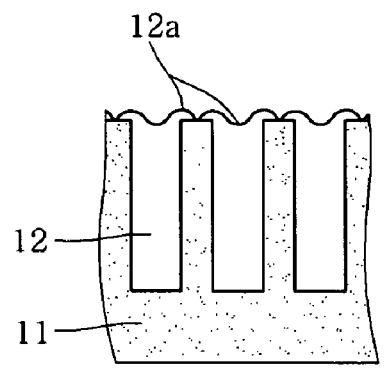

When the plurality of grooves 11a is formed on the common electrode member 11, the sealing dielectric layer 12 may be formed by sealing a nano dielectric powder with a high dielectric constant in the plurality of grooves 11a using an electrophoresis scheme, as shown in FIGS. 5c through 5e. In order to seal the dielectric powder in the plurality of grooves with a particle size of 1 μm through 20 μm, the nano dielectric powder may be used for the dielectric powder. A particle size of the nano dielectric powder may be formed to be 10 nm through 300 nm. The material thereof may use any one of $BaTiO_3$, $SrTiO_3$, $CaTiO_3$, $TiO_2$, and $Ta_2O_5$.

Even when forming the sealing dielectric layer 12 by sealing the plurality of grooves 11a using the nano dielectric powder, a sealing process and a cleaning process may be iterated to fill the nano dielectric powder from the bottom of the grooves 11a.

For example, as shown in FIG. 5c, a process of sealing the nano dielectric powder with a high dielectric constant in the plurality of grooves 11a formed on the common electrode member 11 using an electrophoresis scheme may be performed. When the sealing process is completed, a process of cleaning the nano dielectric powder using an ultrasonic wave or bubbling cleaning scheme may be performed. The cleaning scheme may remove the nano dielectric powder applied in an upper portion of an inner circumferential surface of the grooves 11a to form the sealing dielectric layer 12 as shown in FIG. 5c.

When the sealing dielectric layer 12 is formed as shown in FIG. 5c, the nano dielectric powder may be bottom up filled to seal the plurality of grooves 11a as shown in FIGS. 5d and 5e by iterating the sealing process and the cleaning process. By iterating the sealing process and the cleaning process, it is possible to prevent the nano dielectric powder from being applied from an inlet of the grooves 11a and thereby to enable the nano dielectric powder to be bottom up filled from the bottom of the grooves 11a and to be sealed in the sealing dielectric layer 12 without an unsealed space, thereby forming the dielectric layer 12.

Figure 5F:
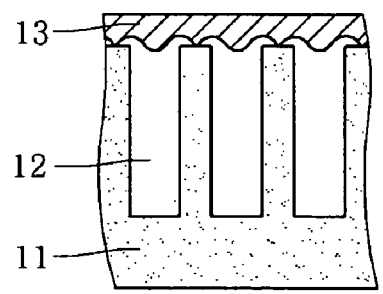

When the sealing dielectric layer 12 is formed, the common electrode member 11 formed with the sealing dielectric layer 12 may be dried through a thermal treatment as shown in FIG. 5f. In the drying process, the thermal treatment may be performed in the temperature of 170° C. through 230° C. to dry the sealing dielectric layer 12.

Figure 5G:
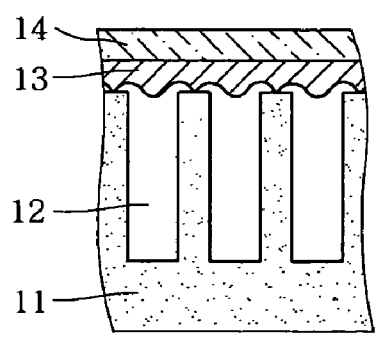

When the drying process is completed, the buffer dielectric layer 13 may be formed to smooth the surface using a silk printing scheme to seal the uneven portion 12a of the sealing dielectric layer 12 formed on the common electrode member 11, as shown in FIG. 5g. Specifically, the buffer dielectric layer 13 may be formed to smooth the uneven portion 12a formed while sealing the sealing dielectric layer 12 in the plurality of grooves 11a. A paste may be used to smooth the uneven portion 12a using the buffer dielectric layer 13, and may be applied using the silk printing scheme. A material thereof may include epoxy of 20 Vol % through 80 Vol % and dielectric powder of 20 Vol % through 80 Vol %. Here, the dielectric powder may use any one of $BaTiO_3$, $SrTiO_3$, $CaTiO_3$, and $Ta_2O_5$, and a particle size thereof is 0.1 μm through 10 μm.

When the smoothing process is completed, the individual electrode member 14 may be formed by applying a conductive material to the buffer dielectric layer 13. The conductive material to form the individual electrode member 14 may use any one of Al, Ta, Ag, and Cu.

Hereinafter, an embedded capacitor sheet 10 to form the embedded capacitor C, constructed as above, in a sheet form according to an embodiment of the present invention will be described in detail with reference to the accompanying drawings.

As shown in FIGS. 1 through 4, the embedded capacitor sheet 10 may include the common electrode member 11, the sealing dielectric layer 12, the buffer dielectric layer 13, and a plurality of individual electrode members 14. Here, the sealing dielectric layer 12 and the buffer dielectric layer 13 may function as a dielectric substance of the embedded capacitor C. The common electrode member 11 and each of the individual electrode members 14 may function as an upper electrode and a lower electrode, respectively, to constitute a plurality of embedded capacitors C.

The plurality of grooves 11a may be formed on the common electrode member 11. The sealing dielectric layer 12 may be formed by sealing the nano dielectric powder with the high dielectric constant in the plurality of grooves 11a formed on the common electrode member 11. The sealing dielectric layer 12 may be applied on a surface of the common electrode member 11 where the plurality of grooves 11a is formed. The buffer dielectric layer 1 may seal and smooth the uneven portion 12a of the sealing dielectric layer 12 by applying a paste or a slurry including epoxy of 20 Vol % through 80 Vol % and dielectric powder of 20 Vol % through 80 Vol % with respect to the sealing dielectric layer 12. The plurality of individual electrode members 14 may be formed on the buffer dielectric layer 13. Specifically, each of the individual electrode members 14 may constitute a single embedded capacitor C together with the common electrode member 11, the sealing dielectric member 12, and the buffer dielectric layer 13.

Hereinafter, a manufacturing method of the embedded capacitor sheet 10 constructed as above according to an embodiment of the present invention will be described.

The manufacturing method of the embedded capacitor sheet 10 is the same as the aforementioned manufacturing process of the embedded capacitor C. In the case of the manufacturing method of the embedded capacitor sheet 10, when the buffer dielectric layer 13 is formed, the embedded capacitor sheet 10 may be formed by arranging the plurality of individual electrode members 14 on the buffer dielectric layer 13. Therefore, it will be briefly described with reference to FIGS. 5a through 5g.

When the common electrode member 11 is provided as shown in FIG. 5a, the plurality of grooves 11a may be formed on the common electrode member 11 using the etching scheme as shown in FIG. 5b.

When the plurality of grooves 11a is formed on the common electrode member 11, the sealing dielectric layer 12 may be formed by sealing a nano dielectric powder with a high dielectric constant in the plurality of grooves 11a using an electrophoresis scheme, as shown in FIGS. 5c through 5e. When the sealing dielectric layer 12 is formed, the common electrode member 11 formed with the sealing dielectric layer 12 may be thermally treated and be dried.

When the drying process is completed, the buffer dielectric layer 13 may be formed to smooth the surface using a silk printing scheme or a casting scheme sot that the uneven portion 12a of the sealing dielectric layer 12 formed on the dried common electrode member 11 may be sealed. The smoothing process may apply a paste using the silk printing scheme so that the uneven portion 12a may be sealed. When the paste is applied, the buffer dielectric layer 13 may be formed through a semi-hardening process. In this instance, the semi-hardening process may be performed in the temperature of 80° C. through 150° C.

When the smoothing process is completed to form the buffer dielectric layer 13, a conductive material may be applied to the buffer dielectric layer 13 and the plurality of individual electrode members 14 may be formed using a photo etching process as shown in FIG. 5g. Through this, the embedded capacitor sheet 10 in a sheet form may be manufactured.

Figure 6:
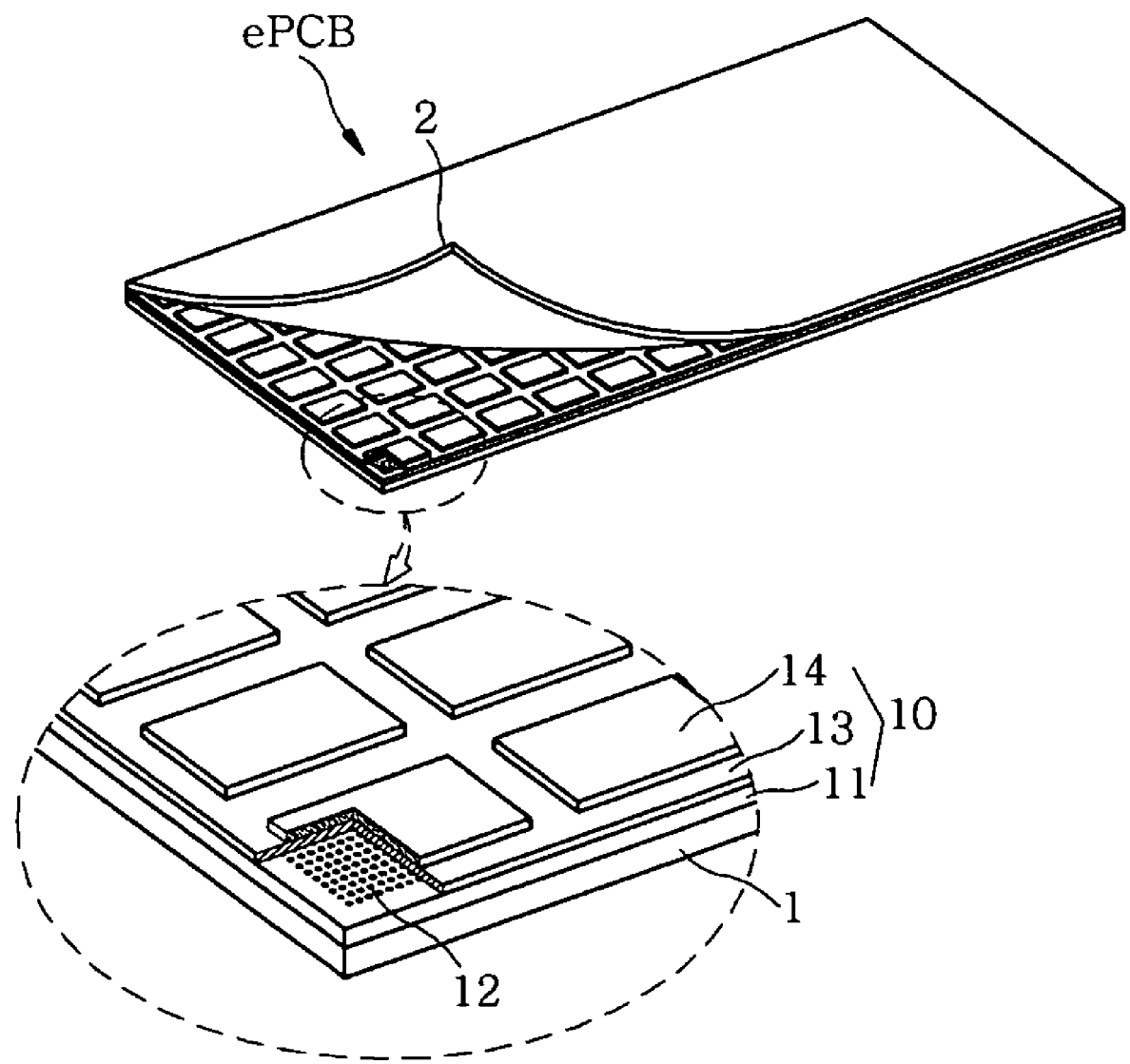
FIG. 6 is a perspective view for describing a use state of an embedded capacitor sheet according to an embodiment of the present invention.

When the semi-hardened embedded capacitor sheet 10 is manufactured, the embedded capacitor sheet 10 may be inserted between the plurality of printed circuit board layers 1 and 2 and thereby be multi-laid to manufacture the embedded printed circuit board ePCB as shown in FIG. 6. Since the embedded capacitor sheet 10 is semi-hardened instead of being completely hardened, and then is multi-laid with the plurality of printed circuit board layers 1 and 2, an adhesive operation may be further easily performed.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An embedded capacitor comprising:
a common electrode member having a volume and including a plurality of transverse grooves defining a plurality of pit-like openings formed through a first surface of said common electrode member and terminating within the volume of said common electrode, wherein the common electrode member uses any one of aluminum (Al), tantalum (Ta), silver (Ag), and copper (Cu), and the common electrode member further comprising an oxide layer formed by anodizing the first surface and the plurality of transverse grooves;

a sealing dielectric layer being formed by sealing a nano dielectric powder with a high dielectric constant in the plurality of transverse grooves formed in the common electrode member, wherein the nano dielectric powder of the sealing dielectric layer uses any one of $BaTiO_3$, $SrTiO_3$, $CaTiO_3$, $TiO_2$, and $Ta_2O_5$, and a particle size thereof is 10 nm through 300 nm;

a buffer dielectric layer sealing and smoothing an uneven portion of the sealing dielectric layer by applying a paste or a slurry including epoxy of 20 Vol % through 80 Vol % and dielectric powder of 20 Vol % through 80 Vol % with respect to the sealing dielectric layer, wherein the dielectric powder of the buffer dielectric layer uses any one of $BaTiO_3$, $SrTiO_3$, $CaTiO_3$, and $Ta_2O_5$, and a particle size thereof is 0.1 μm through 10 μm; and an individual electrode member being formed on the buffer dielectric layer and positioned over a portion of said plurality of transverse grooves formed in the common electrode member, wherein the individual electrode member uses any one of aluminum (Al), tantalum (Ta), silver (Ag), and copper (Cu).

2. An embedded capacitor sheet comprising:

a common electrode member having a volume and including a plurality of transverse grooves defining a plurality of pit-like openings formed through a first surface of said common electrode member and terminating within the volume of said common electrode, wherein the common electrode member uses any one of aluminum (Al), tantalum (Ta), silver (Ag), and copper (Cu), and the common electrode member further comprising an oxide layer formed by anodizing the first surface and the plurality of transverse grooves;

a sealing dielectric layer being formed by sealing a nano dielectric powder with a high dielectric constant in the plurality of transverse grooves formed in the common electrode member, wherein the nano dielectric powder of the sealing dielectric layer uses any one of $BaTiO_3$, $SrTiO_3$, $CaTiO_3$, $TiO_2$, and $Ta_2O_5$, and a particle size thereof is 10 nm through 300 nm;

a buffer dielectric layer sealing and smoothing an uneven portion of the sealing dielectric layer by applying a paste or a slurry including epoxy of 20 Vol % through 80 Vol % and dielectric powder of 20 Vol % through 80 Vol % with respect to the sealing dielectric layer, wherein the dielectric powder of the buffer dielectric layer uses any one of $BaTiO_3$, $SrTiO_3$, $CaTiO_3$, and $Ta_2O_5$, and a particle size thereof is 0.1 μm through 10 μm; and a plurality of individual electrode members being formed on the buffer dielectric layer and positioned over portions of said plurality of transverse grooves formed in the common electrode member, wherein each of the individual electrode members uses any one of aluminum (Al), tantalum (Ta), silver (Ag), and copper (Cu).

* * * * *